(12) United States Patent
Gao

(10) Patent No.: US 10,727,553 B1
(45) Date of Patent: Jul. 28, 2020

(54) THERMAL MANAGEMENT SYSTEM DESIGN FOR BATTERY PACK

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/458,739

(22) Filed: Jul. 1, 2019

(51) Int. Cl.
| | | |
|---|---|---|
| H01M 10/6568 | (2014.01) |
| H05K 7/14 | (2006.01) |
| H01M 10/613 | (2014.01) |
| H01M 10/627 | (2014.01) |
| H05K 7/20 | (2006.01) |
| H02J 7/00 | (2006.01) |
| H01M 2/10 | (2006.01) |
| H01M 10/44 | (2006.01) |
| H01M 10/63 | (2014.01) |

(52) U.S. Cl.
CPC ..... H01M 10/6568 (2015.04); H01M 2/1077 (2013.01); H01M 10/441 (2013.01); H01M 10/613 (2015.04); H01M 10/627 (2015.04); H01M 10/63 (2015.04); H02J 7/0013 (2013.01); H05K 7/1489 (2013.01); H05K 7/1492 (2013.01); H05K 7/20154 (2013.01); H05K 7/20172 (2013.01); H05K 7/20263 (2013.01); H05K 7/20272 (2013.01); H05K 7/20327 (2013.01); H05K 7/20781 (2013.01); H05K 7/20818 (2013.01); *H01M 2220/10* (2013.01)

(58) Field of Classification Search
CPC ............. H01M 10/613; H01M 10/627; H01M 10/6567–6569; H01M 2220/10
See application file for complete search history.

(56) References Cited

U.S. PATENT DOCUMENTS

| | | | |
|---|---|---|---|
| 2011/0027631 A1* | 2/2011 | Koenigsmann ..... | H01M 2/1077 429/62 |
| 2017/0179551 A1* | 6/2017 | Shepard ............ | H01M 10/6568 |
| 2018/0287225 A1* | 10/2018 | Haag .................. | H01M 10/613 |
| 2018/0316031 A1* | 11/2018 | Song .................. | H01M 8/04201 |
| 2019/0016231 A1* | 1/2019 | Scaringe ................. | B60L 50/66 |

(Continued)

*Primary Examiner* — Robert J Hoffberg
(74) *Attorney, Agent, or Firm* — Womble Bond Dickinson (US) LLP

(57) ABSTRACT

A method for self-sensing, activating, and regulating thermal management for a rack-mount backup battery unit (BBU) module is disclosed. The BBU module includes a data center rack-mountable chassis, battery cells submerged in a coolant in a liquid phase in a coolant tank, the coolant extracting heat from the plurality of battery cells when at least some of the battery cells are being charged or discharged, and a cooling loop having a heat exchanger, a supply line for supplying lower-temperature coolant from the heat exchanger to the coolant tank, and a return line for returning higher-temperature or multi-phase coolant from the coolant tank to the heat exchanger, wherein the higher-temperature or multi-phase coolant is cooled and transformed into lower-temperature coolant or single phase liquid at the heat exchanger, and wherein the cooling loop is in operation when at least some of the plurality of battery cells are being charged or discharged, and is idle when none of the plurality of battery cells are being charged or discharged.

20 Claims, 11 Drawing Sheets

(56) References Cited

U.S. PATENT DOCUMENTS

| | | | |
|---|---|---|---|
| 2019/0267683 A1* | 8/2019 | Shepard | H01G 11/82 |
| 2020/0028224 A1* | 1/2020 | Hofer | H01M 10/625 |
| 2020/0052356 A1* | 2/2020 | Eadelson | H01M 10/6556 |

* cited by examiner

THERMAL MANAGEMENT SYSTEM DESIGN FOR BATTERY PACK

TECHNICAL FIELD

Embodiments of the present disclosure relate generally to a cooling apparatus and system. More particularly, embodiments of the disclosure relate to thermal management of a battery backup unit installed in a datacenter environment.

BACKGROUND

A battery pack consists of battery cells connected in series, in parallel or, a combination of both. The battery cells generate heat during discharging and charging. The speed of discharging is positively correlated with the heat generated. A cooling system for the battery pack is very important because a higher temperature or a lower temperature may negatively impact the battery performance as well as battery health conditions. Since multiple cells are connected together, a significant difference in internal temperature values can lead to different charging and discharging rates for different cells and thus cause the battery pack performance to deteriorate. Therefore, the battery thermal management system plays a vital role in the design and operation of the battery pack, and has a direct impact on the performance of the battery pack. In addition, a bad design of a thermal system may result in the BBU failed to function, such as failure to satisfy the backup time needed.

Several conventional battery thermal management systems for cooling electric vehicles exist. These include, for example, the air cooling system, the passive or active liquid system, and the thermo-electric system. However, such systems are insufficient.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
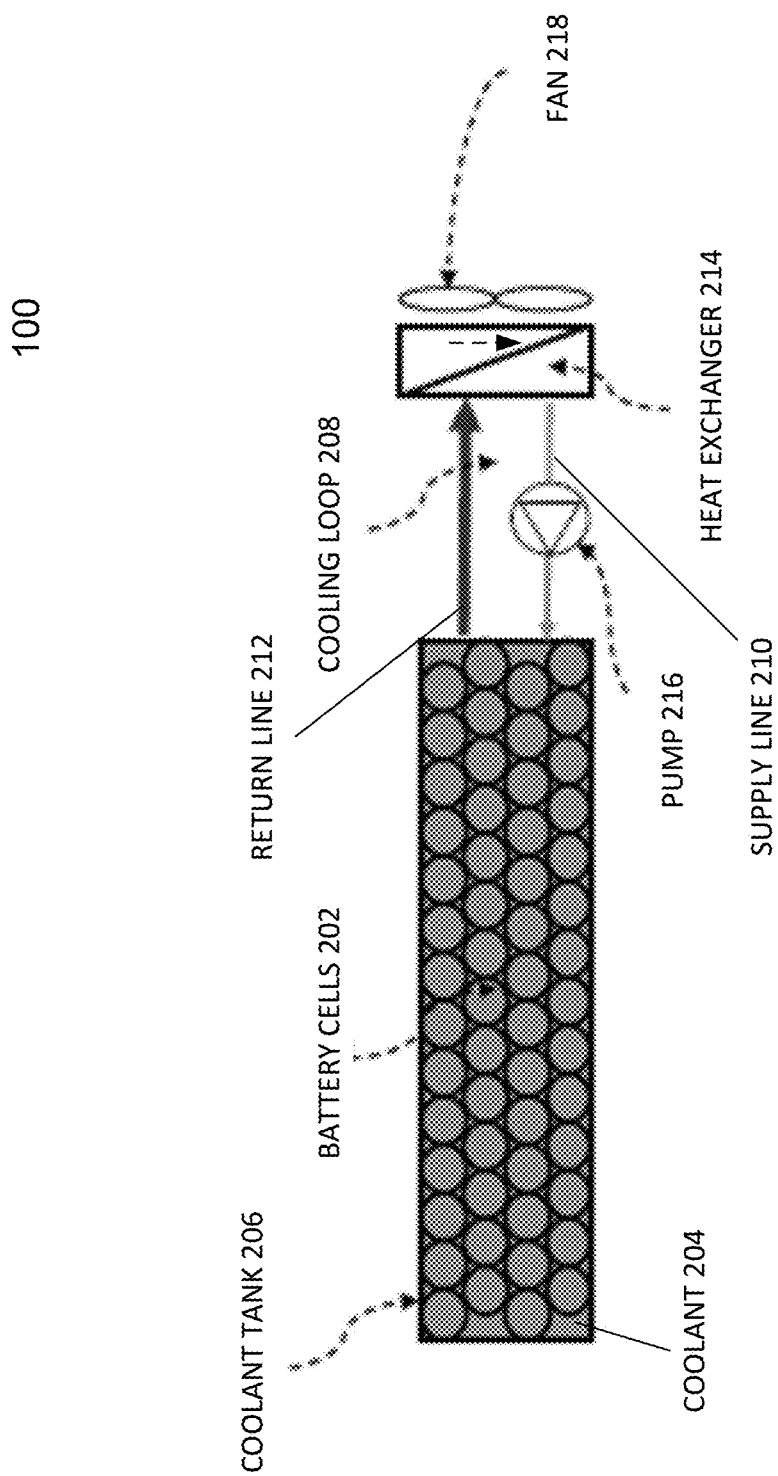
FIG. 1 shows an example of a backup battery module according to one embodiment.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to some embodiments, a thermal management system design is utilized for battery packs for data center applications. A battery pack includes a number of battery cells submerged into coolant contained in a coolant tank or immersion tank, either a single-phase or multi-phase coolant. For a single-phase coolant, the coolant is circulated between a heat exchanger and the battery pack extracting the heat generated from the batter cells. For multi-phase coolant, the build changes phase from a liquid state to a vapor state when the battery cells start to generate heat during a discharging or charging process. The vapor returns back to the heat exchanger where it gets cooled and condensed back to fluid. In a liquid cooling loop design, a fluid pump is used for driving the fluid. For external cooling design, both air cooling and liquid cooling may be utilized. An air cooling system utilizes a fan to circulate the air of a data center as a cooling source. A liquid cooling system utilizes data center and/or rack liquid cooling systems. The battery cooling system, including the pump and the fan, stays inactive when the battery pack does not operate (e.g., charge or discharge). When the battery cells are charged or discharged, the battery pack provides power to the pump and the fan to automatically activate the battery cooling system.

According to one aspect, a backup battery module includes a coolant tank containing coolant therein, an array of battery cells submerged in the coolant in the coolant tank, the coolant extracting heat from the battery cells, a heat exchanger coupled to the coolant tank via a coolant supply line and a coolant return line to form a battery cell liquid cooling loop, and a pump disposed on the coolant supply line or the coolant return line to circulate the coolant through the battery cell liquid cooling loop. The pump is turned on to circulate the coolant in response to charging or discharging of at least some of the battery cells. The pump is powered off when the battery cells are not being charged or discharged.

In one embodiment, the pump is coupled to a charging circuit of the battery cells, which when the battery cells are being charged or discharged, provides power to turn on the pump. The pump is powered by at least some of the battery cells. The backup battery module further includes a direct current to direct current (DC/DC) convertor that converts a power output of at least some the battery cells into a voltage suitable for the pump. In one embodiment, the coolant is a single-phase liquid coolant or a two-phase coolant, the two-phase coolant being in the liquid phase when in a low pressure liquid state, and in a vapor phase when in a higher-pressure state. Note that the phase change does not necessarily change the fluid temperature, where the heat is latent heat that coverts the liquid to vapor. In one embodiment, the heat exchanger is an air-to-liquid heat exchanger. The backup battery module further includes a fan to air-cool the heat exchanger. In another embodiment, the heat exchanger is liquid-to-liquid heat exchanger coupled to a rack liquid cooling system to form a rack liquid cooling loop.

According to another aspect, a backup battery unit (BBU), also referred to as a backup battery pack, includes an array of backup battery modules contained in a rack mountable chassis suitable to be inserted in any of the server slots of an electronic rack of a data center. Each of the backup battery modules in the BBU includes at least some of the components of a backup battery module described above.

According to a further aspect, an electronic rack of a data center includes a stack of server blades, each of the server blades containing one or more server therein, a power supply unit to provide power to the server blades, and a backup battery pack to provide backup power to the servers when the power supply is unable to provide power or any other power outage situations. Each of the backup battery modules in the backup battery pack of the electronic rack includes at least some of the components of a backup battery module described above.

FIG. 1 shows an example of a battery module according to one embodiment. Referring to FIG. 1, battery module 100 includes a number of battery cells 202 submerged in coolant 204 contained in a coolant tank 206. As shown in FIG. 1, battery cells 202 are connected in series-parallel. The cooling loop 208 includes the coolant tank 206 that contains the majority of the coolant fluid 204, a supply line 210, a return line 212, and a cooling device such as a heat exchanger 214. In this embodiment, a fluid pump 216 is disposed on the supply line and is operable to facilitate circulation of the coolant 204. Alternatively, pump 216 may be disposed on the return line 212 or additional pump may be dispose don the return line 212. The heat exchanger 214 may be either an air-to-liquid heat exchanger or alternatively, heat exchanger 214 can be a liquid-to-liquid heat exchanger as shown in FIG. 2.

In one embodiment, a fan 218 is used for moving the air and facilitating the operation of the heat exchanger 214. In one embodiment, data center cooling air (i.e., lower-temperature air centrally supplied in the data center) is used to cool the heat exchanger 214. If a phase change coolant 204 is used, vapor condensation occurs within the heat exchanger 214. The phase change takes place in both the coolant tank 206 and the heat exchanger 214.

Figure 2:
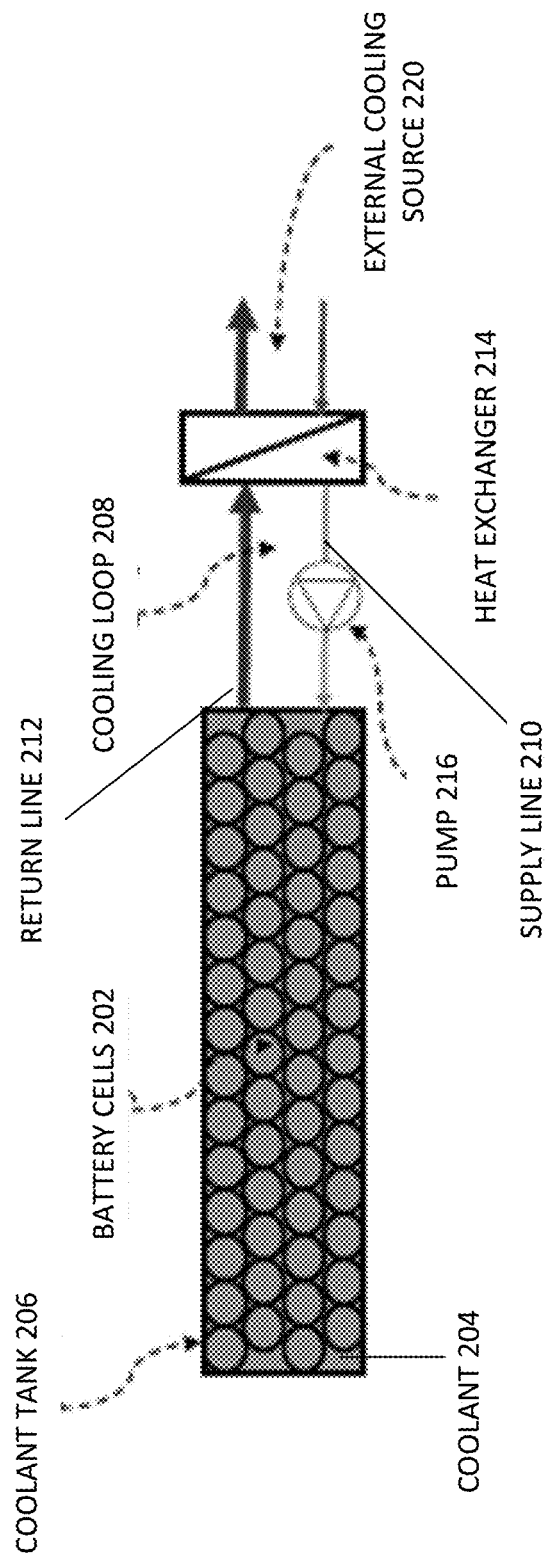
FIG. 2 shows an example of a backup battery module according to another embodiment.

Referring now to FIG. 2, the heat exchanger 214 is connected to an external cooling source 220. In a different embodiment, the external cooling source 220 may be a data center cooling water system or an IT liquid cooling water system. In this example as shown in FIG. 2, heat exchanger 214 is a liquid-to-liquid heat exchanger. The cooling loop between heat exchanger 214 and external cooling source 220 may be referred to as a primary loop, while the cooling loop between heat exchanger 214 and coolant tank 206 may be referred to as a secondary loop. External cooling source 220 may be a part of a rack liquid manifold disposed within an electronic rack in which backup battery module 200 is located or a coolant distribution unit (CDU) located within the electronic rack. When a single phase coolant is used, both the supply and return lines are liquid lines. In the two-phase coolant design, the supply line 210 is a liquid line, while the return line 212 is a vapor line. The diameter of the vapor line may be larger than the diameter of the liquid line.

Figure 3:
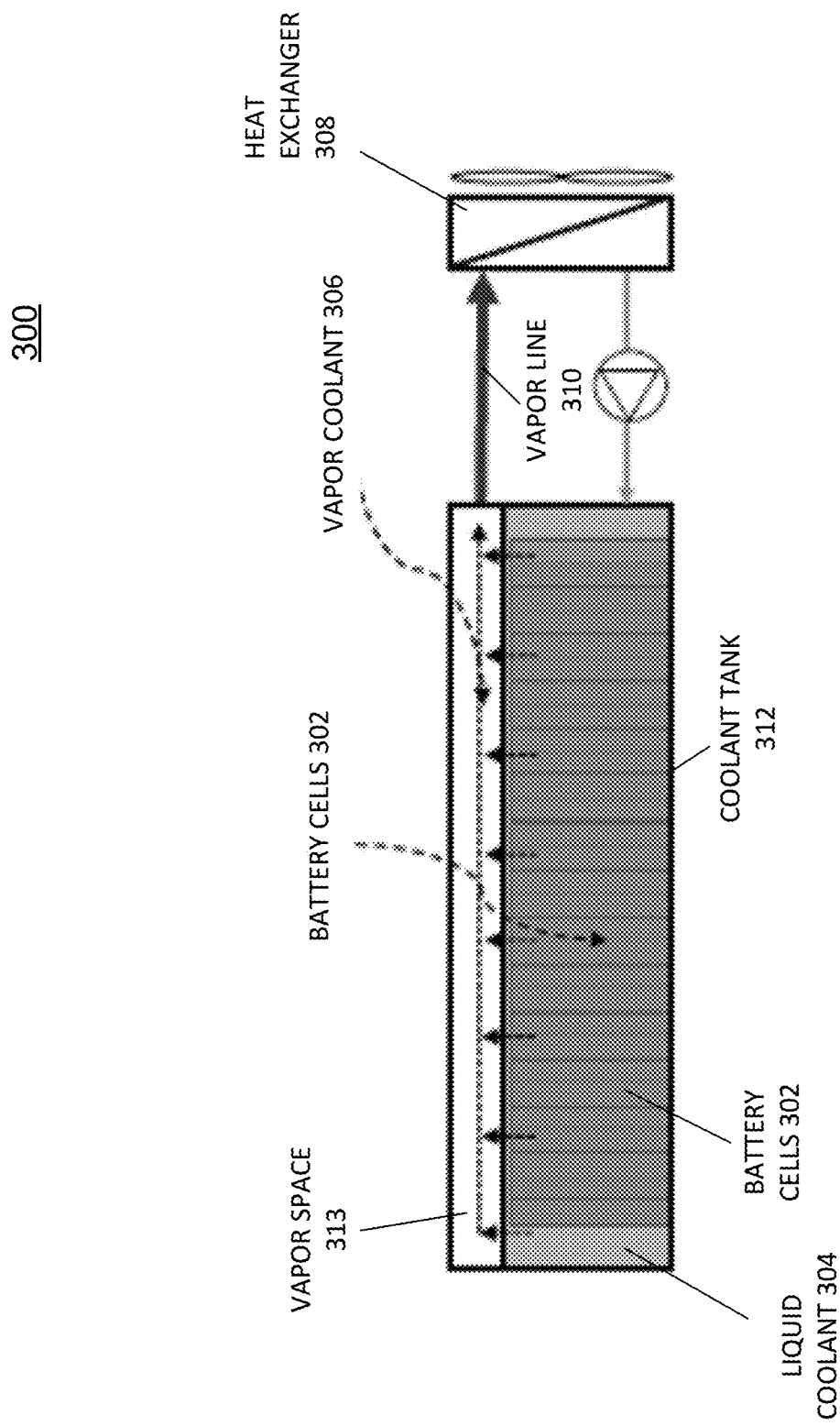
FIG. 3 shows an example backup battery module having a cooling system according to one embodiment.

Referring to FIG. 3, an example backup battery module 300 having a cooling system according to one embodiment is shown. In this embodiment, a two-phase coolant is used. When the battery cells 302 generate heat, the liquid coolant 304 extracts the heat from the battery cells, and the coolant changes from a liquid phase to a vapor phase. The low density vapor coolant 306 ascends in the coolant tank 312 and travels to the heat exchanger 308 through a vapor return line 310. In other words, in this embodiment, the coolant tank 312, which is also a battery chamber, is not fully filled, and a space 313 is reserved toward the top of the coolant tank 312 to allow for the generation of the vapor 306 and to act as a buffer for balancing the pressure differential due to the variation in densities.

Figure 4A:
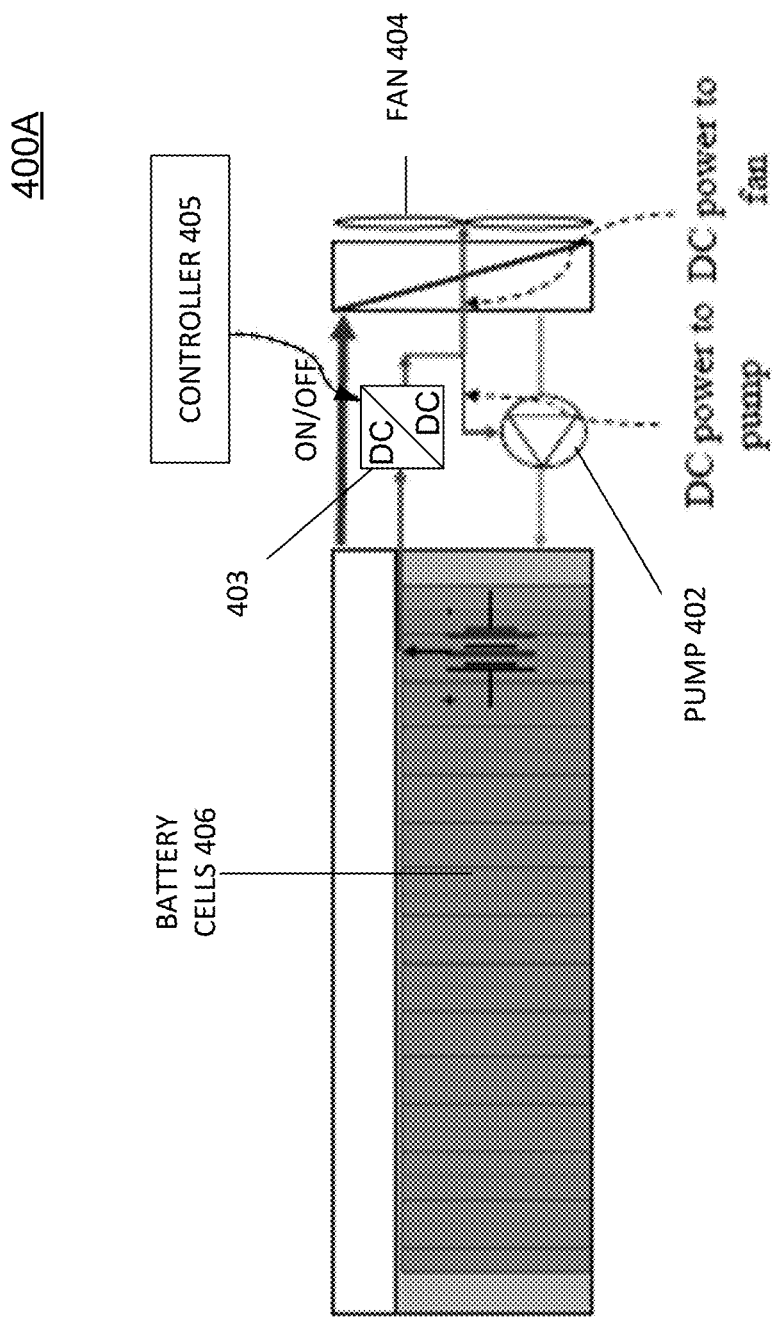
FIGS. 4A-4C show example backup battery modules having cooling systems according to certain embodiments.
Figure 4B:
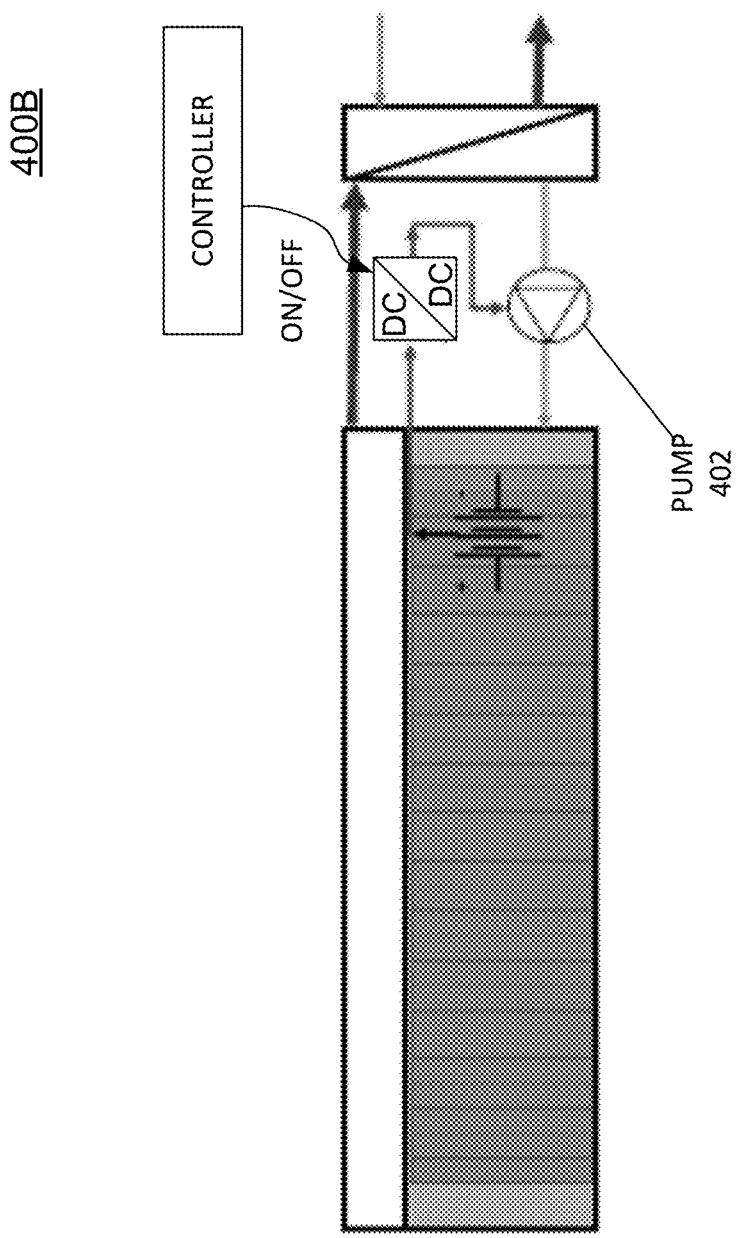
Figure 4C:
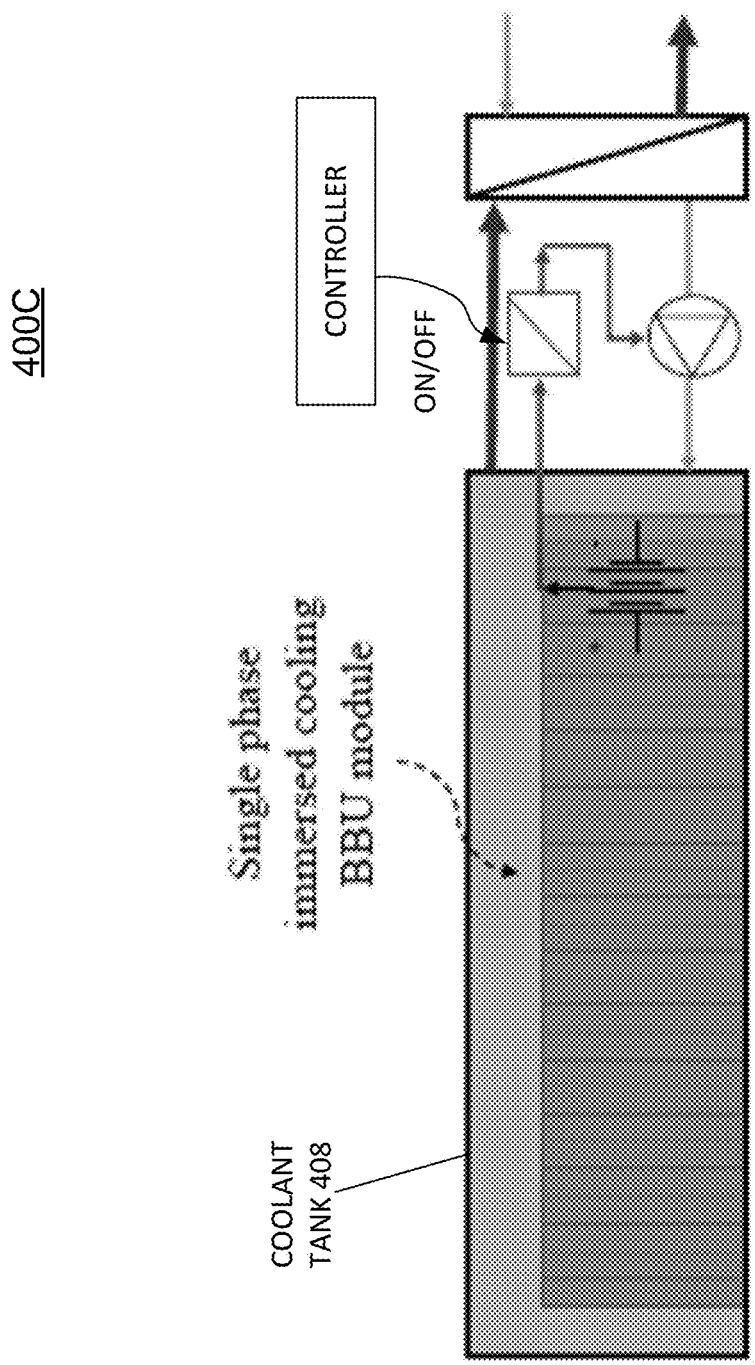

Referring to FIGS. 4A-4C, example backup battery modules 400A-400C having cooling systems according to certain embodiments are shown. FIGS. 4A-4C show a mechanism for delivering power to the cooling system. The pump 402 and/or the fan 404 require direct current (DC) power for normal operations. The DC power to operate the pump 402 and/or the fan 404 is supplied only by the battery cells 406, and only when at least some of the battery cells 406 are being charged or discharged. Thus, the system is self-powered and efficient.

For example, a DC to DC (DC/DC) convertor 403 is used to regulate the output voltage (e.g., 12V). When the battery cells 406 are fully charged and maintained at floating voltage conditions, the power supply from the converter to the pump and/or the fan is shut off by a controller 405, and the cooling system returns to an inactive/idle mode. By idle and inactive, this means that the cooling system is not actively or passively circulating coolant between the coolant tank and the condenser. In other words, the cooling system is only activated by the controller when needed (e.g., when the controller detects that the batteries are being charged and discharged).

In FIG. 4A, DC power is supplied to both a fan 404 and a pump 402. In FIG. 4B, DC power is supplied only to a pump 402. It should be understood that the controller can be integral to the DC/DC converter, a battery control system of the battery module, or elsewhere, such as on the electronic rack. The controller can be any combination of one or more processors, field programmable gate arrays (FPGAs), complex programmable logic device (CPLDs), relays, contactors, and/or other electronic circuits and components capable of implementing logic. The controller can sense when the cooling system is needed based on input from one or more sensors, which can include any combination of temperature sensing of the battery cells, the tank, or the coolant, and current sensing of battery current (e.g., charge and/or discharge current).

In one embodiment, the cooling system for the backup battery module is inactive when the backup battery module is not in operation, for example, when the backup battery module is not in any of the mode such as charging, discharging, state of health (SOH) testing, and so on. In other words, the cooling system for the BBU module is self-sensing and self-regulating, and can self-activate and self-adjust automatically when it needed.

In one embodiment, the cooling system is activated during both charging and discharging periods. In another embodiment, the cooling system is activated only during a discharging period, and is not activated during a charging period. This is because the heat is generated with a much slower rate during a charging period than during a discharging period, and the cumulated heat within the battery pack may dissipate fast and sufficient enough through natural convection such that the battery cell temperature does not exceed the thermal specification.

FIG. 4C illustrates an embodiment where a single phase coolant is used and the same mechanism is utilized to deliver DC power to the cooling system. As can be seen in FIG. 4C, the coolant tank 408 is fully filled with the liquid coolant. DC power is supplied to a pump 402. In another embodiment, the coolant tank 408 may be partially-filled. A partially filled system may be good for system pressure balancing when the fluid variations in temperatures. Also, the system operating may require some system purging design for purging the air if any air becomes trapped within the loop.

Figure 5A:
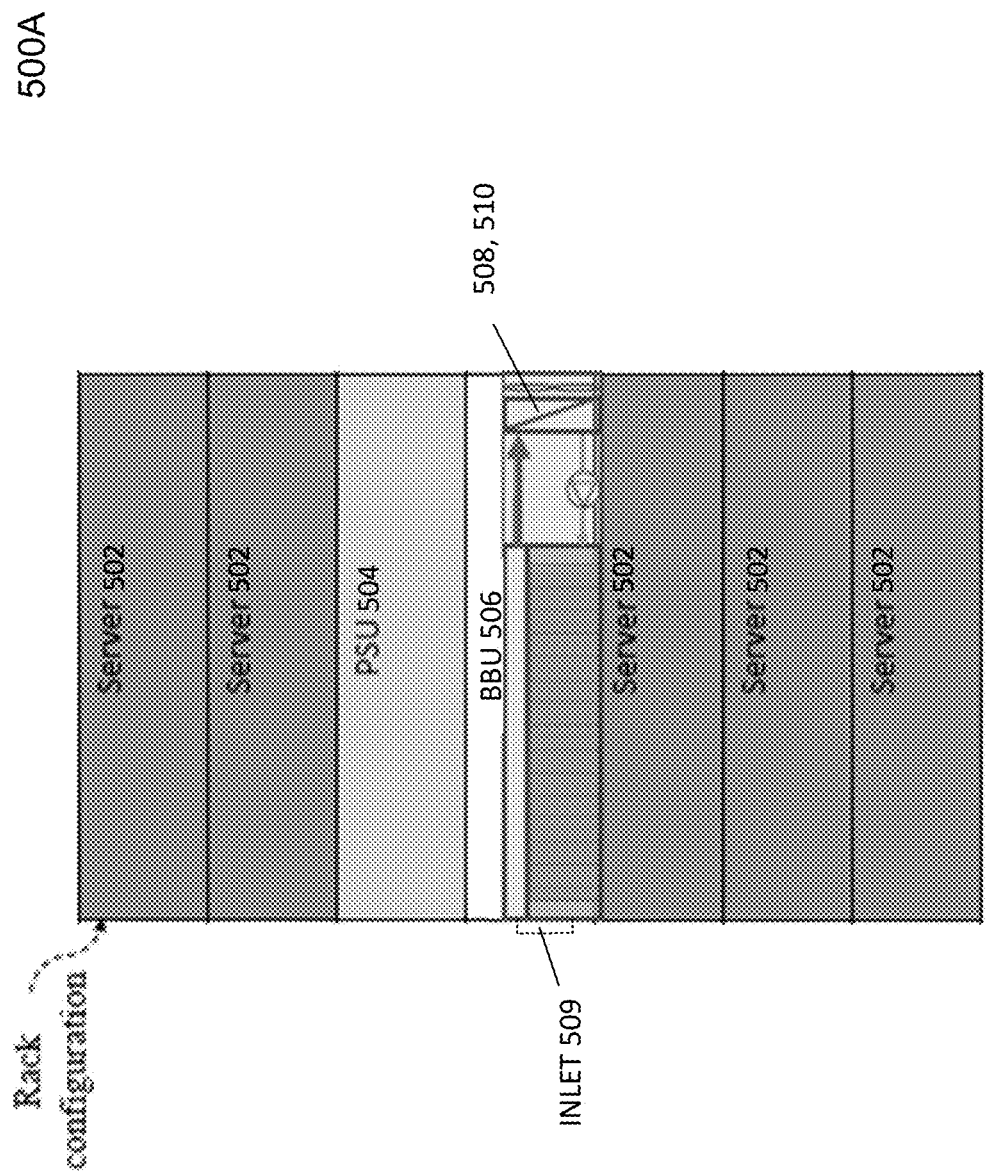
FIGS. 5A and 5B show example electronic racks having backup battery packs mounted therein according to certain embodiments.
Figure 5B:
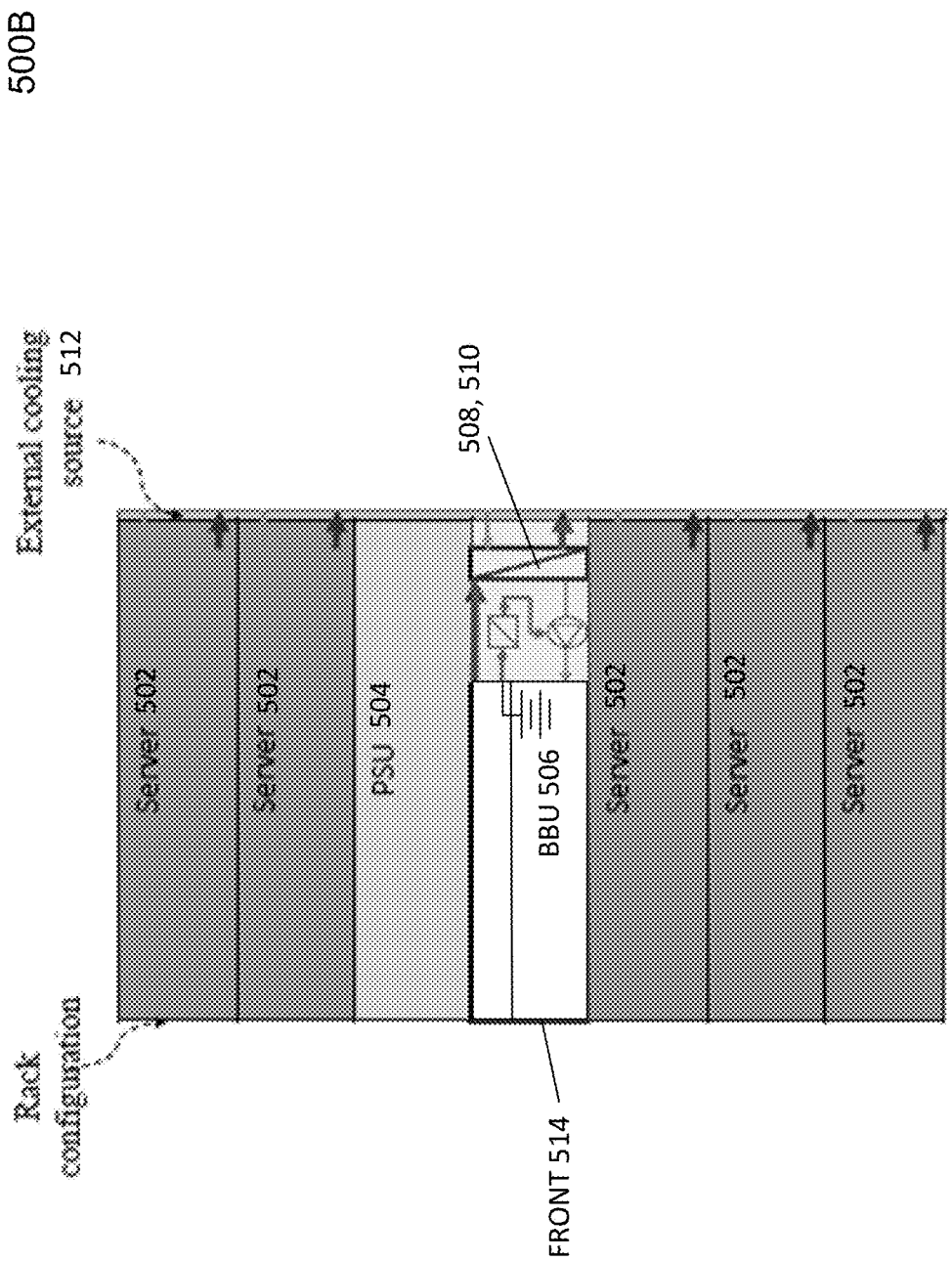

Referring to FIGS. 5A and 5B, example racks 500A, 500B comprising BBUs mounted therein according to embodiments are shown. The racks 500A and 500B may be conventional racks commonly found within data centers. In FIG. 5A, the IT rack 500A is populated with servers 502 (each of which comprises a central processing unit "CPU", a graphic processing unit "GPU", and/or storage devices, etc.), a power supply unit (PSU) 504, a BBU 506, and a switch (not shown). The BBU 506 comprises a cooling system 508 according to one of the embodiments described herein. In FIG. 5A, the heat exchanger 510 in the BBU cooling system 508 is air-cooled. Therefore, it should be appreciated that space may be needed to allow cooling air to pass through the heat exchanger of the BBU cooling system from the cold aisle to the hot aisle. Note that although not shown an air space may be maintained between server slots for air cooling. FIG. 5B is similar to FIG. 5A, except that the heat exchanger 510 in the BBU cooling system 508 is liquid-cooled. Therefore, the BBU 506 (especially the heat exchanger in the cooling system) needs to be connected to an external cooling source 512. In different embodiments, the external cooling source 512 can be either a data center cooling water loop (i.e., facility water) or an IT liquid cooling water loop. Supply and return manifolds (not shown) are provided to distribute/supply and collect/return the external cooling liquid.

Figure 6A:
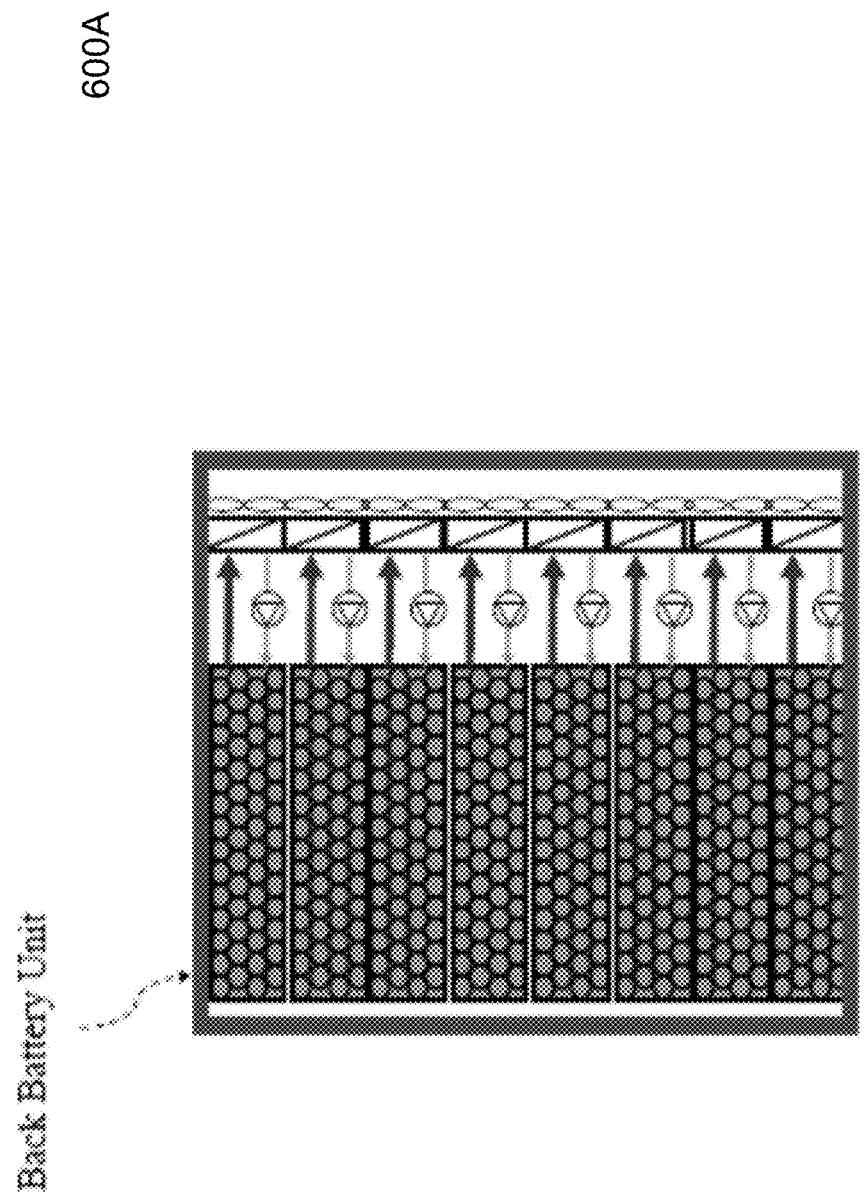
FIGS. 6A and 6B are example rack-mount backup battery pack shelf unit which multiple backup battery pack is assembled according to certain embodiments.
Figure 6B:
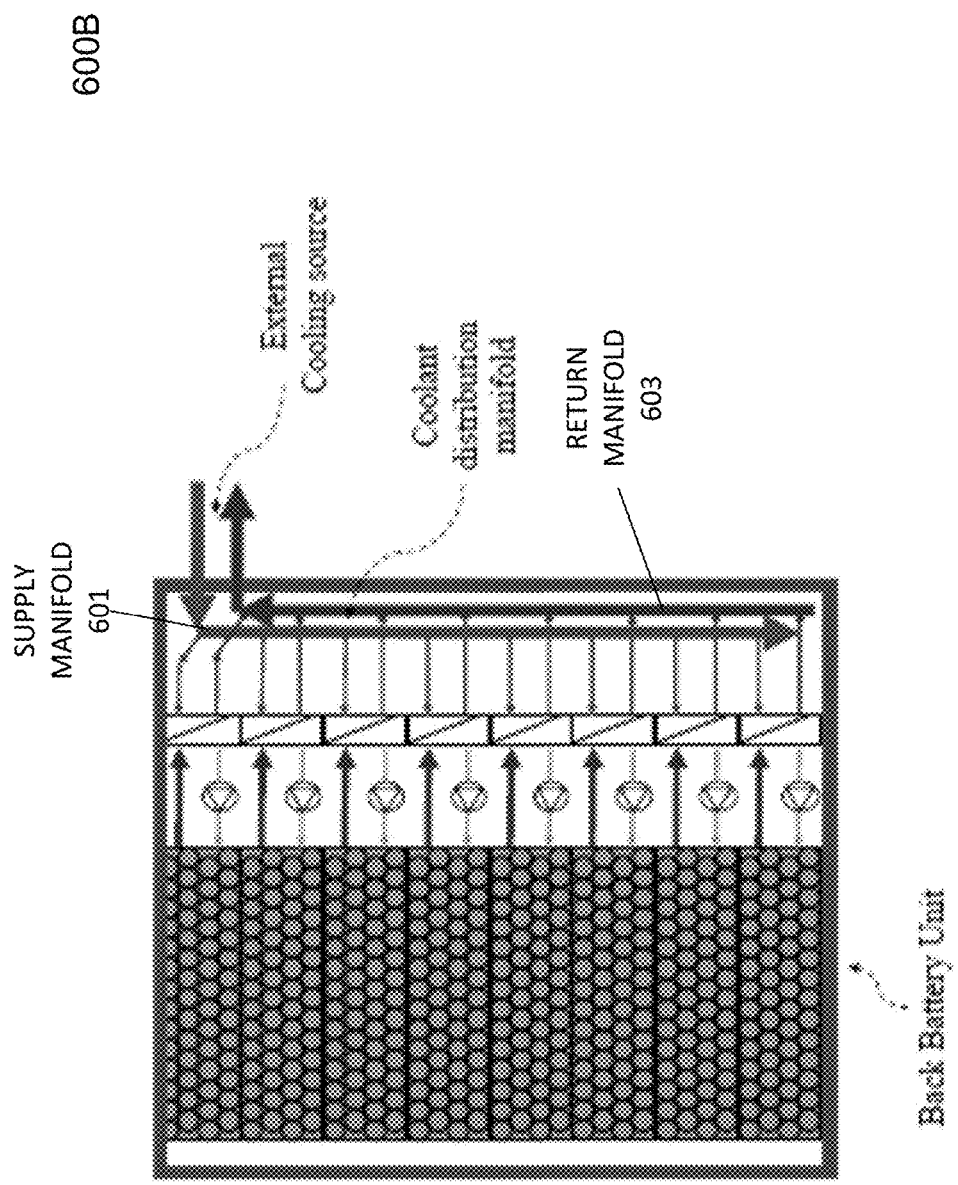

Referring to FIGS. 6A and 6B, example rack-mount BBU shelf unit 600A, 600B according to embodiments are shown. A BBU shelf unit, also referred to as a backup battery unit, includes a number of individual backup battery modules (also referred to as a backup battery unit or BBU, which multiple cells are packaged within), each backup battery module including battery cells, a coolant tank, heat exchanger, and supply and return lines as described above. For different use scenarios associated with different power density requirements, the same BBU shelf unit may be populated with different numbers of backup battery modules. Therefore, the compatibility between backup battery modules and a BBU shelf unit is important.

FIG. 6A illustrates an air-cooled BBU shelf unit 600A. The modular design of the BBU shelf unit enables each of the individual BBU modules to manage its thermal profile independently of other modules in the same shelf unit. FIG. 6B illustrates a liquid-cooled BBU shelf unit 600B. Each of the BBU modules requires a connection to the external cooling source. In other words, an external supply line and an external return line are needed for each individual BBU module. In one embodiment, fluid supply manifold 601 and return manifold 603 are disposed in the BBU shelf unit, as shown with unit 600B. The BBU shelf unit is then connected to the rack cooling supply and return sources. The supply and return manifolds are used for distributing and collecting the external cooling liquid between the rack cooling source and the individual BBU modules. Therefore, it should be appreciated that when a liquid-cooled BBU module is installed in a BBU shelf, its external supply and return lines are connected to the supply and return manifolds to enable the liquid cooling of its heat exchanger.

In one embodiment, the BBU liquid manifold can be integrated with the corresponding hoses and connectors. These can be designed as one single module, for easy installation, service and maintenance.

Note that a server that is backed by a battery pack/BBU can be any information technology (IT) component or element that when operates, generates heat. A server can include a processor, a field programmable gate array (FPGA), an application specific integrated circuit (ASIC), or any computing components. One or more servers can be placed in an electronic rack of a data center. A server may be contained within a server blade which is inserted into one of the server slots of an electronic rack. Each server includes a processor, a memory, a storage device, and a network interface that are configured to provide data processing services to clients. Such components may generate heat during normal operations. Also note that condensers of the battery modules can each include a cooling member which can be a cold plate using liquid cooling, in which liquid-to-liquid heat exchange is performed using a rack cooling unit, a room cooling unit, and/or a datacenter cooling unit.

Figure 7:
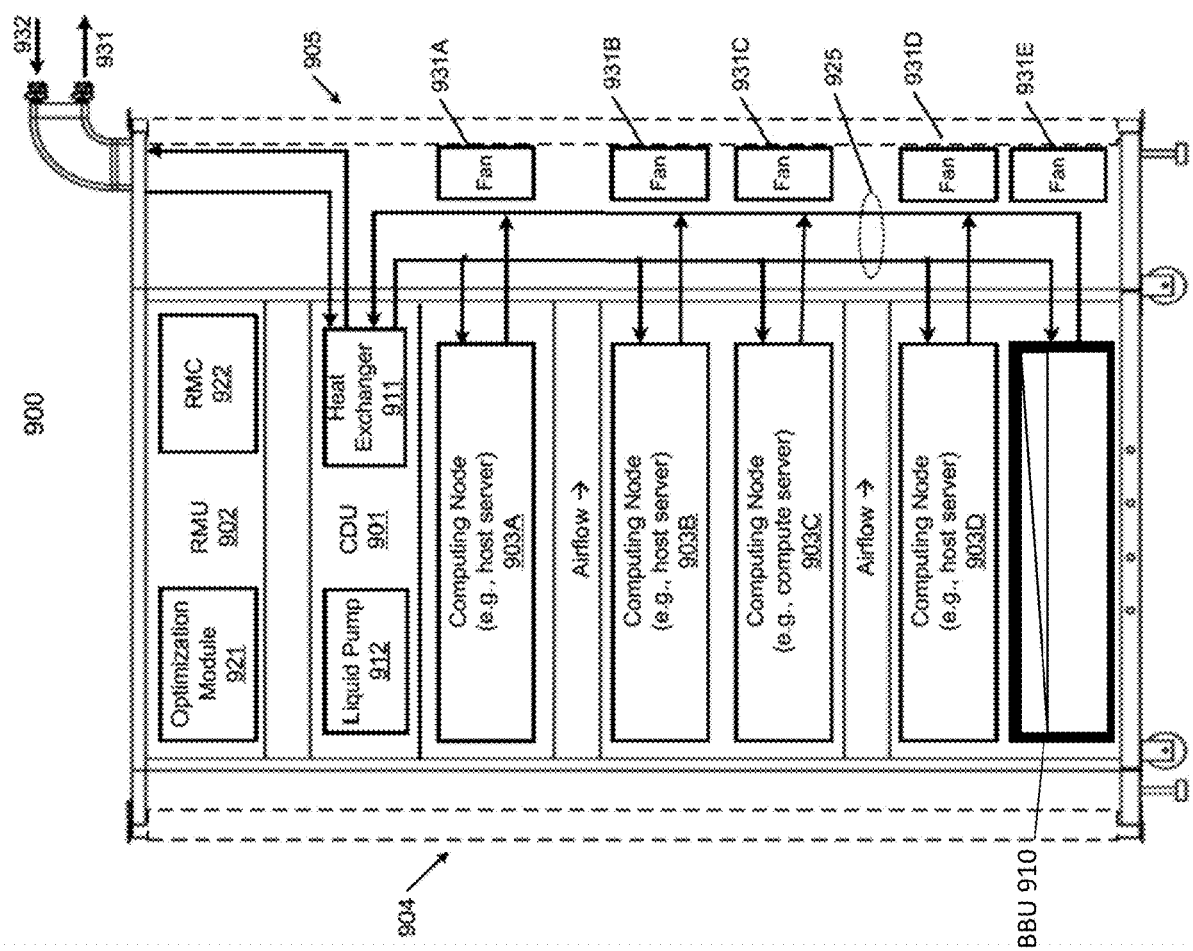
FIG. 7 shows an example of an electronic rack containing a backup battery pack according to one embodiment.

FIG. 7 is a block diagram illustrating an example of an electronic rack according to one embodiment. Electronic rack 900 may contain one or more servers, each server having one or more processing units attached to a bottom of any of the cooling devices described above. Referring to FIG. 7, according to one embodiment, electronic rack 900 includes, but is not limited to, CDU 901, rack management unit (RMU) 902 (optional), a BBU 910 and one or more server blades 903A-903D (collectively referred to as server blades 903). Server blades 903 can be inserted into an array of server slots respectively from frontend 904 or backend 905 of electronic rack 900. The BBU 910 may populate any space or shelf within the rack.

Note that although there are only four server blades 903A-903D shown here, more or fewer server blades may be maintained within electronic rack 900. Also note that the particular positions of CDU 901, RMU 902, and server blades 903 are shown for the purpose of illustration only; other arrangements or configurations of CDU 901, RMU 902, BBU 910, and server blades 903 may also be implemented. Note that electronic rack 900 can be either open to the environment or partially contained by a rack container, as long as the cooling fans can generate airflows from the frontend to the backend.

In addition, a fan module can be associated with each of the server blades 903, and BBU 910. In this embodiment, fan modules 931A-931E, collectively referred to as fan modules 931, and are associated with server blades 903A-903D and BBU 910 respectively. Each of the fan modules 931 includes one or more cooling fans. Fan modules 931 may be mounted on the backends of server blades 903 and BBU 910 to generate airflows flowing from frontend 904, traveling through the air space of the sever blades 903, and existing at backend 905 of electronic rack 900.

In one embodiment, CDU 901 mainly includes heat exchanger 911, liquid pump 912, and a pump controller (not shown), and some other components such as a liquid reservoir, a power supply, monitoring sensors and so on. Heat exchanger 911 may be a liquid-to-liquid heat exchanger. Heat exchanger 911 includes a first loop with inlet and outlet ports having a first pair of liquid connectors coupled to external liquid supply/return lines 931-932 to form a primary loop. The connectors coupled to the external liquid supply/return lines 931-932 may be disposed or mounted on backend 905 of electronic rack 900. The liquid supply/return lines 931-932 are coupled to a set of room manifolds, which are coupled to an external heat removal system, or extremal cooling loop. In addition, heat exchanger 911 further includes a second loop with two ports having a second pair of liquid connectors coupled to liquid manifold 925 to form a secondary loop, which may include a supply manifold to supply cooling liquid to server blades 903 and a return manifold to return warmer liquid back to CDU 901. Note that CDUs 901 can be any kind of CDUs commercially available or customized ones. Thus, the details of CDUs 901 will not be described herein.

Each of server blades 903 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. Server blades 903 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 900 further includes optional RMU 902 configured to provide and manage power supplied to servers 903, fan modules 931, and CDU 901. Optimization module 921 and RMC 922 can communicate with controller 405 of FIG. 4A in some of the applications. RMU 902 may be coupled to a power supply unit (not shown) to manage the power consumption of the power supply unit. The power supply unit may include the necessary circuitry (e.g., an alternating current (AC) to direct current (DC) or DC to DC power converter, backup battery, transformer, or regulator, etc.) to provide power to the rest of the components of electronic rack 900.

In one embodiment, RMU 902 includes optimization module 921 and rack management controller (RMC) 922. RMC 922 may include a monitor to monitor operating status of various components within electronic rack 900, such as, for example, computing nodes 903, CDU 901, and fan modules 931. Specifically, the monitor receives operating data from various sensors representing the operating environments of electronic rack 900. For example, the monitor may receive operating data representing temperatures of the processors, cooling liquid, and airflows, which may be captured and collected via various temperature sensors. The monitor may also receive data representing the fan power and pump power generated by the fan modules 931 and liquid pump 912, which may be proportional to their respective speeds. These operating data are referred to as real-time operating data. Note that the monitor may be implemented as a separate module within RMU 902.

Based on the operating data, optimization module 921 performs an optimization using a predetermined optimization function or optimization model to derive a set of optimal fan speeds for fan modules 931 and an optimal pump speed for liquid pump 912, such that the total power consumption of liquid pump 912 and fan modules 931 reaches minimum, while the operating data associated with liquid pump 912 and cooling fans of fan modules 931 are within their respective designed specifications. Once the optimal pump speed and optimal fan speeds have been determined, RMC 922 configures liquid pump 912 and cooling fans of fan modules 931 based on the optimal pump speed and fan speeds.

As an example, based on the optimal pump speed, RMC 922 communicates with a pump controller of CDU 901 to control the speed of liquid pump 912, which in turn controls a liquid flow rate of cooling liquid supplied to the liquid manifold 925 to be distributed to at least some of server blades 903. Therefore, the operating condition and the corresponding cooling device performance is adjusted. Similarly, based on the optimal fan speeds, RMC 922 communicates with each of the fan modules 931 to control the speed of each cooling fan of the fan modules 931, which in turn control the airflow rates of the fan modules 931. Note that each of fan modules 931 may be individually controlled with its specific optimal fan speed, and different fan modules and/or different cooling fans within the same fan module may have different optimal fan speeds.

Note that some or all of the IT components of servers 903 may be attached to any one of the cooling devices described above, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling. In addition, a switch is not shown here, which can be either air cooled or liquid cooled.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A backup battery module for providing backup power to an electrical load, comprising:
   a coolant tank containing coolant therein;
   a plurality of battery cells submerged in the coolant in the coolant tank, the coolant extracting heat from the battery cells;
   a heat exchanger coupled to the coolant tank via a coolant supply line and a coolant return line to form a battery cell liquid cooling loop;
   a pump disposed along the coolant supply line or the coolant return line to circulate the coolant through the battery cell liquid cooling loop; and
   a controller configured to control the pump in (i) a charging mode when at least some of the battery cells are charging, (ii) a discharging mode when the at least some or at least another of the battery cells being configured to provide the backup power to the electrical load, and (iii) an inactive/idle mode when the battery cells are in neither of the charging mode nor the discharging mode,
   wherein the pump is turned on to circulate the coolant in the charging mode and the discharging mode, and
   wherein the pump is powered off in the inactive/idle mode.

2. The backup battery module of claim 1, wherein the pump is coupled to the battery cells, which when the battery cells are being charged or discharged, the battery cells provide power to turn on the pump.

3. The backup battery module of claim 1, wherein when the battery cells are being charged or discharged, the pump is powered by the at least some of the battery cells.

4. The backup battery module of claim 3, further comprising a direct current to direct current (DC/DC) convertor that converts a power output of the at least some the battery cells into a voltage suitable for turning on the pump.

5. The backup battery module of claim 1, wherein the coolant is a single-phase liquid coolant.

6. The backup battery module of claim 1, wherein the coolant is a two-phase coolant, the two-phase coolant being in a liquid phase when in a lower-temperature state, and in a vapor phase when in a higher-temperature state.

7. The backup battery module of claim 1, wherein the heat exchanger is a liquid-to-air heat exchanger.

8. The backup battery module of claim 7, further comprising a fan to air-cool the liquid-to-air heat exchanger.

9. The backup battery module of claim 1, wherein the heat exchanger is a liquid-to-liquid heat exchanger coupled to a rack liquid cooling system to form a rack liquid cooling loop.

10. A backup battery unit for providing backup power to an electronic rack, comprising:
   a plurality of backup battery modules, wherein each of the backup battery modules includes:
      a coolant tank containing coolant therein,
      a plurality of battery cells submerged in the coolant in the coolant tank, the coolant extracting heat from the battery cells,
      a heat exchanger coupled to the coolant tank via a coolant supply line and a coolant return line to form a battery cell liquid cooling loop,
      a pump disposed along the coolant supply line or the coolant return line to circulate the coolant through the battery cell liquid cooling loop, and
      a controller configured to control the pump in (i) a charging mode when at least some of the battery cells are charging, (ii) a discharging mode when the at least some or at least another of the battery cells being configured to provide the backup power to the electronic rack, and (iii) an inactive/idle mode when the battery cells are in neither of the charging mode nor the discharging mode,
      wherein the pump is turned on to circulate the coolant in the charging mode and the discharging mode, and
      wherein the pump is powered off in the inactive/idle mode; and
   a rack mountable chassis housing the plurality of backup battery modules, wherein the rack mountable chassis is suitable to be inserted into one of a plurality of server slots of the electronic rack of a data center.

11. The backup battery unit of claim 10, wherein the pump is coupled to the battery cells, which when the battery cells are being charged or discharged, the battery cells provide power to turn on the pump.

12. The backup battery unit of claim 10, wherein when the battery cells are being charged or discharged, the pump is powered by the at least some of the battery cells.

13. The backup battery unit of claim 12, wherein each of the backup battery modules further comprises a direct current to direct current (DC/DC) convertor that converts a power output of the at least some the battery cells into a voltage suitable for the pump.

14. The backup battery unit of claim 10, wherein the coolant is a single-phase liquid coolant.

15. The backup battery unit of claim 10, wherein the coolant is a two-phase coolant, the two-phase coolant being in a liquid phase when in a lower-temperature state, and in a vapor phase when in a higher-temperature state.

16. The backup battery unit of claim 10, wherein the heat exchanger is a liquid-to-air heat exchanger.

17. The backup battery unit of claim 16, wherein each of the backup battery modules further comprises a fan to air-cool the liquid-to-air heat exchanger.

18. The backup battery unit of claim 10, wherein the heat exchanger is a liquid-to-liquid heat exchanger coupled to a rack liquid cooling system to form a rack liquid cooling loop.

19. An electronic rack of a data center, comprising:
   a plurality of server blades arranged in a stack, each of the server blades including one or more servers to provide data processing services;
   a power supply coupled to the server blades to provide power to operate the servers; and
   a backup battery unit coupled to the server blades to provide backup power to the servers when the power supply is unable to provide power, wherein the backup battery unit comprises:
      a plurality of backup battery modules, wherein each of the backup battery modules includes:
      a coolant tank containing coolant therein,
      a plurality of battery cells submerged in the coolant in the coolant tank, the coolant extracting heat from the battery cells,
      a heat exchanger coupled to the coolant tank via a coolant supply line and a coolant return line to form a battery cell liquid cooling loop,
      a pump disposed along the coolant supply line or the coolant return line to circulate the coolant through the battery cell liquid cooling loop, and
      a controller configured to control the pump in (i) a charging mode when at least some of the battery cells are charging, (ii) a discharging mode when the at least some or at least another of the battery cells providing the backup power to the servers, and (iii) an inactive/idle mode when the battery cells are in neither of the charging mode nor the discharging mode,
      wherein the pump is turned on to circulate the coolant in the charging mode and the discharging mode, and
      wherein the pump is powered off in the inactive/idle mode; and
   a rack mountable chassis housing the plurality of backup battery modules, wherein the rack mountable chassis is suitable to be inserted into one of a plurality of server slots of the electronic rack of the data center.

20. The electronic rack of claim 19, wherein the pump is coupled to the battery cells, which when the battery cells are being charged or discharged, the battery cells provide power to turn on the pump.

* * * * *